United States Patent [19]

Baek

[11] Patent Number: 5,637,527
[45] Date of Patent: Jun. 10, 1997

[54] METHOD OF FORMING A CHARGE-STORAGE ELECTRODE OF SEMICONDUCTOR DEVICE

[75] Inventor: Yong K. Baek, Seoul, Rep. of Korea

[73] Assignee: Hyundai Electronics Industries Co., Ltd., Rep. of Korea

[21] Appl. No.: 627,438

[22] Filed: Apr. 4, 1996

[30] Foreign Application Priority Data

Apr. 4, 1995 [KR] Rep. of Korea ............ 95-7846

[51] Int. Cl.$^6$ ................................ H01L 21/8242
[52] U.S. Cl. .......................... 438/396; 438/653
[58] Field of Search ................ 437/60, 190, 192, 437/195, 200, 201, 919

[56] References Cited

U.S. PATENT DOCUMENTS

| 5,137,842 | 8/1992 | Chan et al. | 437/60 |
| 5,335,138 | 8/1994 | Sandhu et al. | 437/60 |
| 5,382,817 | 1/1995 | Kashihara et al. | 257/295 |
| 5,504,041 | 4/1996 | Summerfelt | 437/919 |
| 5,573,979 | 11/1996 | Tsu et al. | 437/190 |

*Primary Examiner*—Chandra Chaudhari
*Attorney, Agent, or Firm*—Fish & Richardson P.C.

[57] ABSTRACT

This invention discloses a method of forming a charge-storage electrode of a semiconductor device by forming a platinum film at a side wall and top area of a polysilicon charge-storage electrode, in which the platinum film restrains a leakage current through a high dielectric film at the same time the capacitance can be increased.

18 Claims, 3 Drawing Sheets

1

METHOD OF FORMING A CHARGE-STORAGE ELECTRODE OF SEMICONDUCTOR DEVICE

BACKGROUND OF THE INVENTION

1. Field of the Invention

This invention relates to a method of forming a charge-storage electrode of a semiconductor device, and more particularly to a method of forming a charge-storage electrode, in which a leakage current through a high dielectric film can be restrained and capacitance can be increased by forming a platinum film at a side wall and top area of a polysilicon charge-storage electrode.

2. Information Disclosure Statement

As semiconductor devices are integrated, cell size is rapidly reduced accordingly. In spite of the reduction of the cell size, a certain amount of capacitance in a storage node is a necessity for the cell operation in a semiconductor device like a Dynamic Random Access Memory(DRAM). Therefore establishing an advanced process and high reliability in a device is needed to minimize the area which the capacitor occupies, while securing the minimum capacitance required for the cell operation.

As a solution to fix this kind of problem, BST(Barium-Strontium Titanate) or PZT(Lead-Zirconium Titanate) is used for a high dielectric film. But in using these dielectric films having a high dielectric constant, stable metal like platinum which is non-reactive is required to maintain characteristics of low leakage current. References are made to FIG. 1 to show a prior art which uses to form a platinum charge-storage electrode of a semiconductor device.

As shown in FIG. 1, a previous method of manufacturing a charge-storage electrode of a semiconductor device in a prior art, comprises: forming an insulating film(3) on a silicon substrate(1) having a junction region(2), etching the insulating film(3) so that the junction region(2) is exposed to form a contact hole for a charge-storage electrode, filling the inside of the contact hole with a polysilicon film(4), depositing a titanium film or a tantalum film as a barrier metal film(5) on the resulting structure, sequentially depositing a platinum film(6) on the barrier metal film(5), consecutively patterning a portion of the platinum film(6) and the barrier metal film(5) to form the charge-storage electrode, forming a high dielectric film(7) on the resulting structure. At this time, the high dielectric film(7) becomes in direct contact with the barrier metal film poor in electrical properties at the side wall of the charge-storage electrode so that it becomes the main reason for the leakage current. In addition, due to the fact that a thick platinum should be deposited to secure a high capacitance at a small charge-storage electrode on the plane, it may result in peeling problem of the platinum film or difficulties in etching process.

SUMMARY OF THE INVENTION

An object of the invention is that it provides a method of forming a charge-storage electrode of a semiconductor device to solve the above disadvantages by forming a platinum film at a side wall and top area of a polysilicon charge-storage electrode. To accomplish the object, the present invention, includes the steps of: forming an insulating film on a silicon substrate having a junction region; etching the insulating film so that the junction region is exposed to form a contact hole for a charge-storage electrode; sequentially depositing a polysilicon film, a first barrier metal film, and a first platinum film on the resulting structure; consecutively patterning a portion of the first platinum film and the first barrier metal film and the polysilicon film to form the charge-storage electrode; sequentially depositing a second barrier metal film and a second platinum film on the resulting film; sequentially blanket etching the second platinum film, the second barrier metal film to leave a spacer at the sidewall of the charge-storage electrode; and then etching the exposed area of the second barrier metal film to a pre-determined depth.

BRIEF DESCRIPTION OF THE DRAWINGS

For fuller understanding of the nature and objects of the invention, reference should be had to the following detailed description taken in conjunction with the accompanying drawing in which.

Similar reference characters refer to similar parts through the several views of the drawings.

DETAILED DESCRIPTION OF THE INVENTION

FIGS. 2A through 2F are cross-sectional views of the semiconductor device to illustrate the procedures of manufacturing a charge-storage electrode at successive steps in accordance with the present invention.

Figure 1:
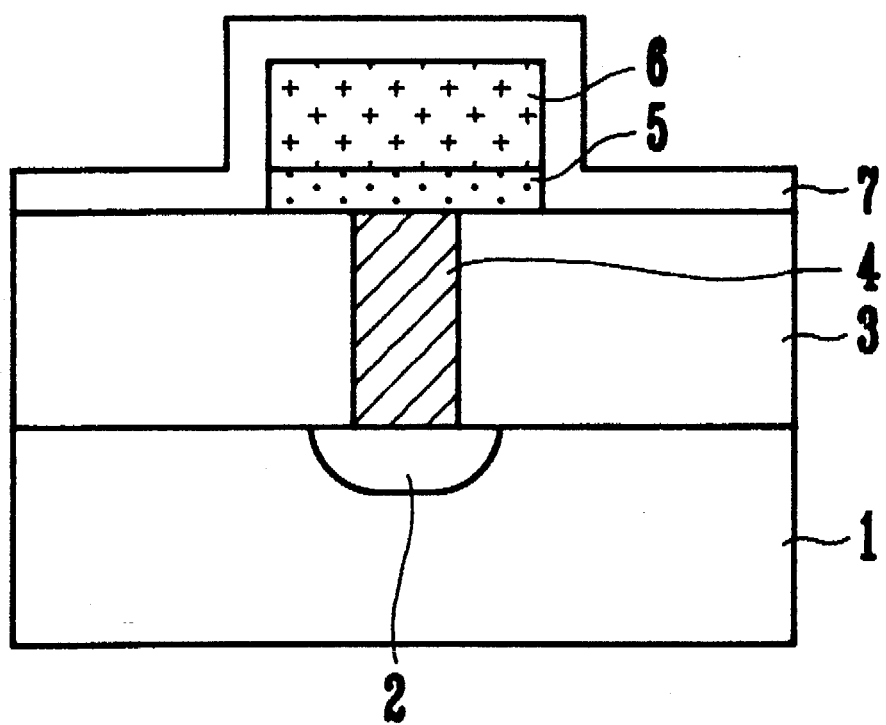
FIG. 1 is a cross-sectional view of a device for explaining a method of manufacturing a charge-storage electrode according to a prior art.
Figure 2A:
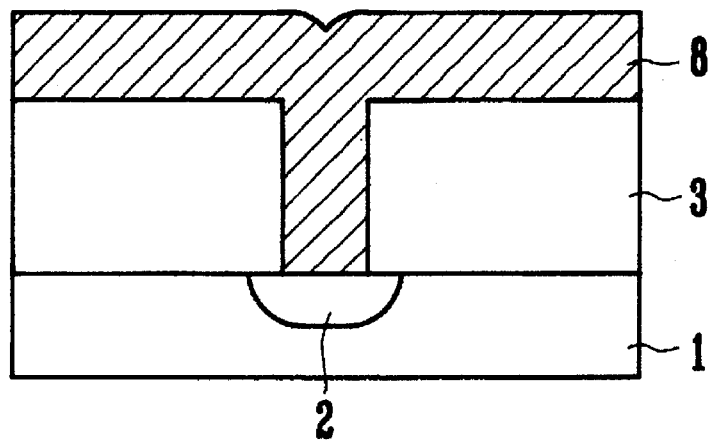
FIGS. 2A through 2F are cross-sectional views of a device in order to show a method of manufacturing a charge-storage electrode of the device in accordance with the present invention.
Figure 2B:
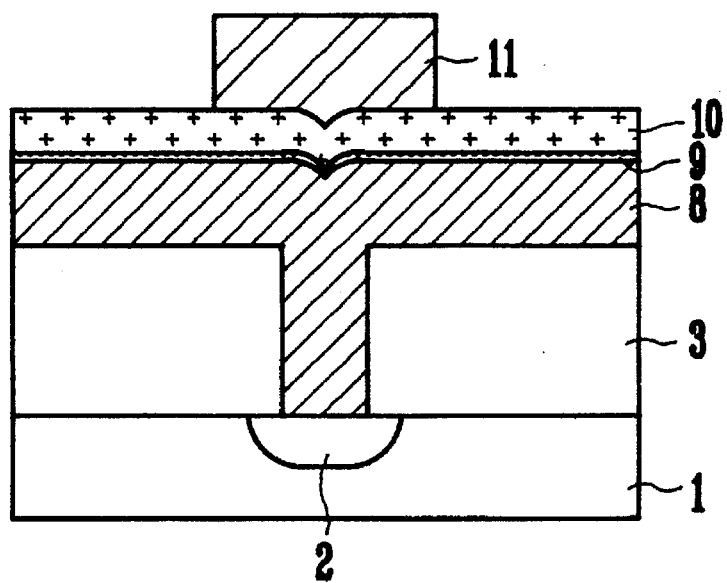

In FIG. 2A, an insulating film(3) is formed on a silicon substrate(1) having a junction region(2) already made. Then to make a contact hole for a charge-storage electrode, the insulating film(3) is etched till the junction region(2) is exposed. After that, a polysilicon film(8) is deposited on the resulting structure, in which the polysilicon film(8) is in-situ phosphorus doped and its thickness should be fixed considering the total area of the side wall of the charge-storage electrode which effects the capacitance of the device.

in FIG. 2B, a titanium film or a tantalum film is deposited to form a first barrier metal film(9) on the resulting structure. The first barrier metal film(9) is deposited of thickness of 100 through 300 Å. And then a first platinum film(10) is sequentially deposited. After that, photo resist film(11) is coated and patterned using a mask for the charge-storage electrode. The first barrier metal film(9) restrains the diffusion between the first platinum film and the underlying polysilicon film(8) and used to promote the adhesion between the platinum film and the polysilicon film which has the property of poor adhesion.

Figure 2C:
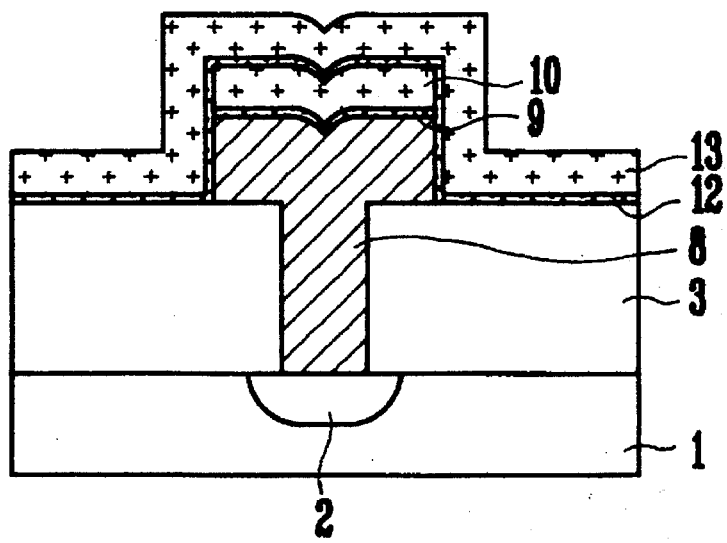

Sequentially etching a portion of the first platinum(10), the first barrier metal film(9) and the polysilicon film(8) using the photoresist film(11) as a mask, sequentially depositing a second barrier metal film(12) and a second platinum film(13) on the resulting structure after removing the photoresist film(11), in which argon sputtering may be done as a pre-treatment before depositing the second barrier metal film(12) to promote adhesion between films, are shown in FIG. 2C. Here the second barrier metal film(12) is deposited of thickness of 100 through 300 Å.

Figure 2D:
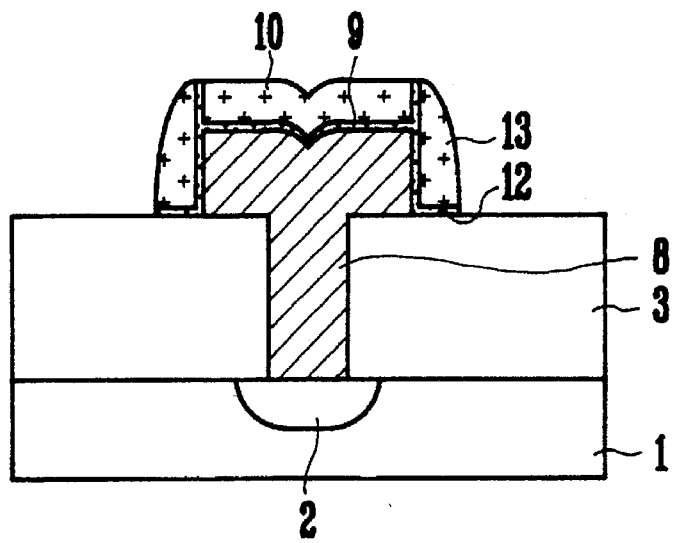

FIG. 2D illustrates that the second platinum film(13) and the second barrier metal film(12) are etched back using a blanket etch process, in which a portion of the second platinum(13) is left a thin spacer at the side wall of the charge-storage electrode. The role of the thin spacer is that it increases the effective area of the charge-storage electrode and promotes the step coverage in the following deposition step of a high dielectric film.

Figure 2E:
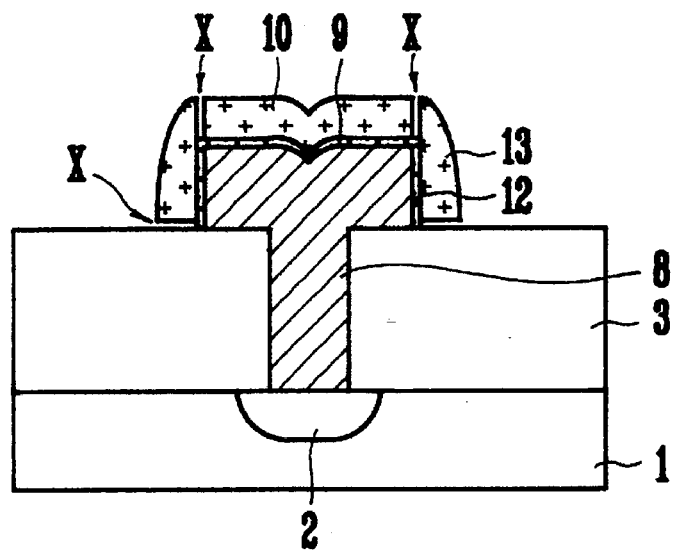

FIG. 2E shows that a groove(indicated by "X" in FIG.) is formed at the both side walls of the first platinum film(10) and under the spacer of the second platinum film(13) formed by etching the exposed part of the second barrier metal film(12) of more than 500 Å using a acidic or basic solution, in which the groove ("X") is used to prevent the electrical properties of a high dielectric film(14) from deteriorating due to the direct contact of the high dielectric film and the second barrier metal film(12) remaining between the first platinum film(10) and the second platinum film(13).

Figure 2F:
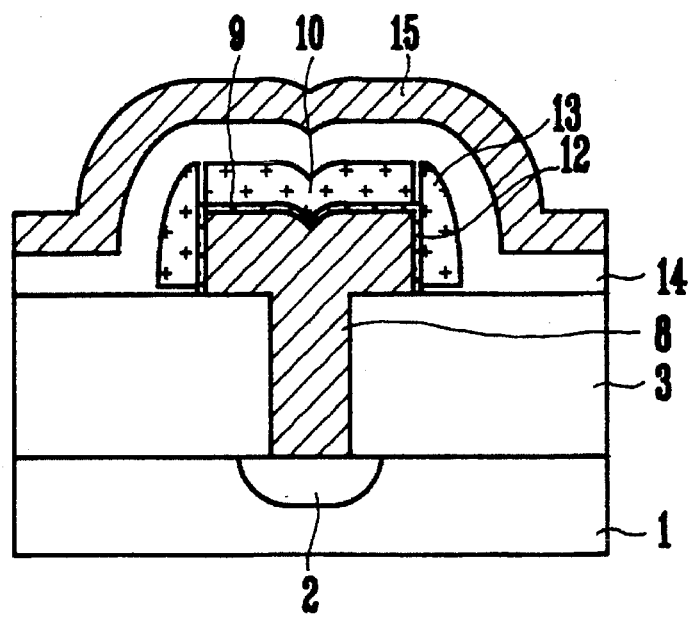

In FIG. 2F, after forming the charge-storage electrode, the high dielectric film(14) and a plating polysilicon film(15) are sequentially deposited to form a capacitor. In depositing the high dielectric film(14), the inside of the groove is completely filled so that the deterioration of the electrical properties of the high dielectric film can be prevented. And also due to the first platinum film(10) formed on the top of the charge-storage electrode, and the thin spacer of the second platinum film(13) formed at the side wall of the charge-storage electrode, the high dielectric property and the low leakage current property can be maintained. Futhermore the use of the thin platinum film improves the peeling problem of the platinum film caused by stress and difficulty in etching.

As described in detail, in accordance with the present invention, as platinum films are formed on the top and at the side wall of the polysilicon charge-storage electrode, the exposed area of the charge-storage electrode is increased and the effective surface area of the charge-storage electrode is also increased so that the resulting capacitance in the limited area can be maximized. And it has a dominant effect on the promotion of the electrical properties of the capacitor by preventing the deterioration of the high dielectric film.

The foregoing description, although described in its preferred embodiment with a certain degree of particularity, is only illustration of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of forming a charge-storage electrode of a semiconductor device, comprising the steps of:

forming an insulating film on a silicon substrate having a junction region;

etching said insulating film so that said junction region is exposed to form a contact hole;

sequentially depositing a polysilicon film, a first barrier metal film, and a first platinum film on the resulting structure after forming said contact hole;

consecutively patterning a portion of said first platinum film, said first barrier metal film, and said polysilicon film;

sequentially depositing a second barrier metal film and a second platinum film on the resulting structure after the patterning process;

sequentially blanket etching said second platinum film and said second barrier metal film to leave a spacer at the sidewall of said polysilicon film; and etching the exposed area of said second barrier metal film, thereby forming a groove at both side wails of said first platinum film and under a spacer of said second second platinum film.

2. The method of claim 1, wherein said polysilicon film is in-situ phosphorus doped.

3. The method of claim 1, wherein said first barrier metal film is formed at least one material of titanium and tantalum.

4. The method of claim 1, wherein said second barrier metal film is formed at least one material of titanium and tantalum.

5. The method of claim 1, wherein the exposed area of said second barrier metal film is etched using acidic solution.

6. The method of claim 1, wherein the exposed area of said second barrier metal film is etched using basic solution.

7. The method of claim 1, further comprising argon sputtering being performed before depositing said second barrier metal film.

8. The method of claim 1, wherein said second barrier metal film is etched of thickness of about 500 Å in said blanket etching.

9. The method of claim 1, wherein said first and said second barrier metal films are deposited of thickness of 100 through 300 Å.

10. A method of forming a charge-storage electrode of a semiconductor device, comprising the steps of:

forming an insulating film on a silicon substrate having a junction region;

etching said insulating film so that said junction region is exposed to form a contact hole;

sequentially depositing a polysilicon film, a first barrier metal film, and a first platinum film on the resulting structure after forming said contact hole;

consecutively patterning a portion of said first platinum film, said first barrier metal film, and said polysilicon film;

sequentially depositing a second barrier metal film and a second platinum film on the resulting structure after the patterning process;

sequentially blanket etching said second platinum film so that a spacer is formed; and etching the exposed area of said second barrier metal film.

11. The method of claim 10, wherein said polysilicon film is in-situ phosphorus doped.

12. The method of claim 10, wherein said first barrier metal film is formed at least one material of titanium and tantalum.

13. The method of claim 10, wherein said second barrier metal film is formed at least one material of titanium and tantalum.

14. The method of claim 10, wherein the exposed area of said second barrier metal film is etched using acidic solution.

15. The method of claim 10, wherein the exposed area of said second barrier metal film is etched using basic solution.

16. The method of claim 10, further comprising argon sputtering being performed before depositing said second barrier metal film.

17. The method of claim 10, wherein said second barrier metal film is etched of thickness of about 500 Å in said blanket etching.

18. The method of claim 10, wherein said first and said second barrier metal films are deposited of thickness of 100 through 300 Å.

* * * * *